United States Patent
Roeger-Goepfert et al.

(10) Patent No.: US 9,869,029 B2
(45) Date of Patent: Jan. 16, 2018

(54) COMPOSITION FOR METAL PLATING COMPRISING SUPPRESSING AGENT FOR VOID FREE SUBMICRON FEATURE FILLING

(75) Inventors: Cornelia Roeger-Goepfert, Schwetzingen (DE); Roman Benedikt Raether, Speyer (DE); Alexandra Haag, Hemhofen (DE); Dieter Mayer, Darmstadt (DE); Charlotte Emnet, Stuttgart (DE)

(73) Assignee: BASF SE, Ludwigshafen (DE)

( * ) Notice: Subject to any disclaimer, the term of this patent is extended or adjusted under 35 U.S.C. 154(b) by 374 days.

(21) Appl. No.: 13/387,776

(22) PCT Filed: Jul. 16, 2010

(86) PCT No.: PCT/EP2010/060276
§ 371 (c)(1),
(2), (4) Date: Jan. 30, 2012

(87) PCT Pub. No.: WO2011/012462
PCT Pub. Date: Feb. 3, 2011

(65) Prior Publication Data
US 2012/0128888 A1    May 24, 2012

Related U.S. Application Data

(60) Provisional application No. 61/229,803, filed on Jul. 30, 2009.

(51) Int. Cl.
*C25D 5/02* (2006.01)
*C25D 3/58* (2006.01)
(Continued)

(52) U.S. Cl.
CPC .............. *C25D 3/38* (2013.01); *C25D 7/123* (2013.01); *H01L 21/2885* (2013.01); *H01L 21/76877* (2013.01); *H05K 3/42* (2013.01)

(58) Field of Classification Search
CPC . C25D 3/38; C25D 7/123; C25D 5/02; C25D 7/12
(Continued)

(56) References Cited

U.S. PATENT DOCUMENTS 3,956,079 A * 5/1976 Kardos et al. ................ 205/298
4,376,685 A * 3/1983 Watson ......................... 205/298
(Continued)

FOREIGN PATENT DOCUMENTS

| GB | 602 591 | 5/1948 |
|---|---|---|
| WO | 02 103751 | 12/2002 |
| WO | 2006 057873 | 6/2006 |

OTHER PUBLICATIONS

U.S. Appl. No. 61/229,809, filed Jul. 3, 2009, Roeger-Goepfert, et al.
(Continued)

*Primary Examiner* — Edna Wong
(74) *Attorney, Agent, or Firm* — Oblon, McClelland, Maier & Neustadt, L.L.P.

(57) ABSTRACT

According to the present invention a composition is provided comprising at least one source of metal ions and at least one additive obtainable by reacting a) a polyhydric alcohol condensate compound derived from at least one polyalcohol of formula (I)

$$X(OH)_n \qquad (I)$$

by condensation with b) at least one alkylene oxide to form a polyhydric alcohol condensate comprising polyoxyalkylene side chains, wherein n is an integer from 3 to 6 and X (Continued)

is an n-valent linear or branched aliphatic or cycloaliphatic radical having from 2 to 10 carbon atoms, which may be substituted or unsubstituted.

22 Claims, 6 Drawing Sheets

(51) Int. Cl.
  *C25D 3/38* (2006.01)
  *H01L 21/288* (2006.01)
  *H01L 21/768* (2006.01)
  *H05K 3/42* (2006.01)
  *C25D 7/12* (2006.01)

(58) Field of Classification Search
  USPC .................. 205/118, 123, 125, 239, 296
  See application file for complete search history.

(56) References Cited

U.S. PATENT DOCUMENTS

| | | | |
|---|---|---|---|
| 4,487,853 A * | 12/1984 | Reichel | C08G 18/4887 521/172 |
| 5,888,373 A * | 3/1999 | Lin et al. | 205/240 |
| 6,776,893 B1 * | 8/2004 | Too | C25D 3/38 106/1.26 |
| 2002/0074242 A1 * | 6/2002 | Morrissey | H01L 21/2885 205/704 |
| 2005/0133376 A1 * | 6/2005 | Opaskar et al. | 205/246 |
| 2006/0201820 A1 | 9/2006 | Opaskar et al. | |
| 2007/0178697 A1 * | 8/2007 | Paneccasio, Jr. | C25D 3/38 438/687 |
| 2012/0018310 A1 | 1/2012 | Roeger-Goepfert et al. | |
| 2012/0024711 A1 | 2/2012 | Roeger-Goepfert et al. | |
| 2012/0027948 A1 | 2/2012 | Roeger-Goepfert et al. | |

OTHER PUBLICATIONS

U.S. Appl. No. 13/384,732, filed Jan. 18, 2012, Roeger-Goepfert, et al.

U.S. Appl. No. 13/535,847, filed Jun. 28, 2012, Roeger-Goepfert, et al.

International Search Report dated Nov. 25, 2011 PCT/EP10/60276 filed on Jul. 16, 2010.

* cited by examiner

COMPOSITION FOR METAL PLATING COMPRISING SUPPRESSING AGENT FOR VOID FREE SUBMICRON FEATURE FILLING

Filling of small features, such as vias and trenches, by copper electroplating is an essential part of the semiconductor manufacture process. It is well known, that the presence of organic substances as additives in the electroplating bath can be crucial in achieving a uniform metal deposit on a substrate surface and in avoiding defects, such as voids and seams, within the copper lines.

One class of additives are the so-called suppressors or suppressing agents. Suppressors are used to provide a substantially bottom-up filling of small features like vias or trenches. The smaller the features are the more sophisticated the additives have to be to avoid voids and seams. In literature, a variety of different suppressing compounds have been described. The mostly used class of suppressors are polyether compounds like polyglycols or polyalkylene oxides like ethylene oxide propylene oxide copolymers.

Such polyether compounds are manufactured by reacting an alcohol starter comprising one or more hydroxyl groups like glycol or glycerol with polyalkylene oxides.

US 2002/0043468 discloses suppressing agents comprising oxygen or nitrogen containing functional groups located in the branches of a polymer backbone. In general, the branched suppressors have a molecular weight in the range of about 10.000 or greater.

US 2004/0217009 A1 discloses poly(alkylene oxide) random copolymers suppressing agents, which may be linear or star-shaped.

With further decreasing aperture size of the features like vias or trenches to dimensions of below 100 nanometers and even below 50 nanometers, respectively, the filling of the interconnects with copper becomes especially challenging, also since the copper seed deposition prior to the copper electrodeposition might exhibit inhomogeneity and non-conformality and thus further decreases the aperture sizes particularly at the top of the apertures. Especially apertures with a seed overhang at the top opening or convex-shaped apertures are challenging to fill and require an especially effective copper growth suppression at the side wall of the feature and the opening of the aperture.

FIG. 3 shows a seeded substrate exhibiting impact of the seed on the opening of the features to be filled. The seed is shown by the light grey layer on the dark grey structures. Since there is an increasing seed overhang issue with further shrinking feature sizes, as depicted in FIG. 3, there is a serious risk of pinch-off void formation in the upper half of the trench close to the opening if the suppressor does not completely avoid sidewall copper growth (2" in FIGS. 2a to 2c). As can be seen the openings are reduced to less than the half of the width without the seed layer resulting in effective aperture sizes of about 18 nanometer to 16 nanometer, respectively. The seeded feature has a convex shape.

It is therefore an object of the present invention to provide a copper electroplating additive having good superfilling properties, in particular suppressing agents capable of providing a substantially voidless and seamless filling of features on the nanometer and on the micrometer scale with a metal electroplating bath, preferably a copper electroplating bath. It is a further object of the present invention to provide a copper electroplating additive capable of providing a substantially voidless and seamless filling of features having a convex shape.

Surprisingly, it has now been found, that the use of polyoxyalkylated polyalcohol condensates as suppressing agents show extraordinary superfilling properties, particularly if used to fill in features having extremely small aperture sizes and/or high aspect ratios. The present invention provides a new class of highly effective, strong suppressing agents that cope with the seed overhang issue and provide substantially defect free trench filling despite a non-conformal copper seed.

Therefore the present invention provides a composition for electroplating metals comprising a source of metal ions and at least one polyoxyalkylated polyalcohol condensate.

According to the present invention a composition is provided comprising at least one source of metal ions and at least one additive obtainable by reacting
a) a polyhydric alcohol condensate compound derived from at least one polyalcohol of formula (I)

$$X(OH)_m \quad (I)$$

by condensation
with
b) at least one alkylene oxide
to form a polyhydric alcohol condensate comprising polyoxyalkylene side chains, wherein m is an integer from 3 to 6 and X is an m-valent linear or branched aliphatic or cycloaliphatic radical having from 2 to 10 carbon atoms, which may be substituted or unsubstituted.

BRIEF DESCRIPTION OF THE DRAWINGS

FIG. 1: FIG. 1a shows a dielectric substrate 1 seeded with a copper layer 2a.

FIG. 2.

FIG. 4.

FIG. 5.

FIG. 6.

Figure 1A:
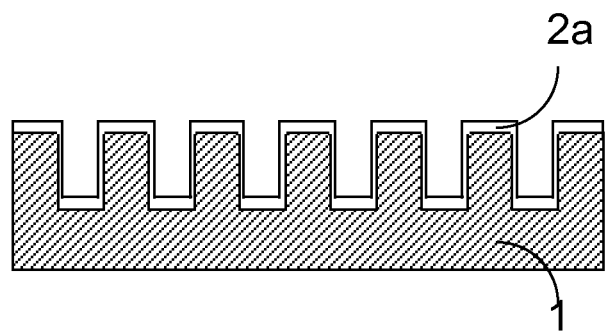

The advantage of the invention is that polyoxyalkylated polyalcohol condensates is their suppressing capability in small features that result in a extraordinarily pronounced bottom-up fill copper growth while perfectly suppressing the sidewall copper growth, both leading to a flat growth front and thus providing substantially defect free trench or via fill. The strong sidewall copper growth suppression of the invention enables non-conformal copper seeded features to be substantially void free filled. Moreover the invention provides an overall homogeneous bottom-up fill in neighboring features of dense feature areas.

The additives according to the present invention are particularly useful for filling of small features, particularly those having aperture sizes of 30 nanometer or below.

In a preferred composition the polyalcohol condensate is a homocondensate of a polyalcohol or a co-condensate of two or more polyalcohols, said polyalcohol condensate comprising from 2 to 50, preferably 2 to 30, particularly preferably 2 to 10, and most preferably 2 to 5, polyalcohol units. Particularly preferred compositions are those wherein the polyalcohol condensate is selected from glycerol condensates, pentaerythritol condensates.

The additive according to the present invention is obtainable by reacting a polyhydric alcohol condensate with alkylene oxide(s). Polyhydric alcohols are also referred to herein as polyalcohols or polyols.

The polyalcohol condensates are formally derived from polyhydric alcohols by condensation, i.e. by linking at least two units together to form an ether linkage and splitting off water, independent whether the polyhydric alcohol condensate is obtained by condensation.

The monomeric units of polyhydric alcohol condensates are polyalcohols represented by formula (I)

wherein m is an integer from 3 to 6 and X is an m-valent linear or branched aliphatic or cycloaliphatic radical having from 2 to 10 carbon atoms.

Suitable polyols of formula (I) are aliphatic polyols, such as glycerol, tri(hydroxymethyl)ethane, tri(hydroxymethyl)propane, pentaerythrit or sorbitol, and cycloaliphatic polyols, such as 1,3,5-trihydroxycyclohexane and the like.

The polyalcohol condensate may be homocondensates or co-condensates.

In a preferred embodiment, the polyalcohol condensate comprises glycerol units.

A preferred polyalcohol homo-condensate is a condensate of glycerol as depicted in formula (IIa)

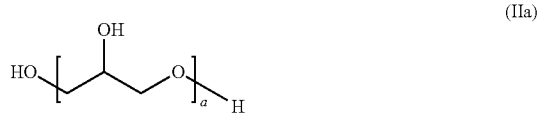

For example, the glycerol condensate (IIa) can be synthesized by condensation of glycerol molecules with elimination of water. The (poly)condensation of glycerol can be carried out by methods known in principle to those skilled in the art while heating glycerol in the presence of catalytic amounts of acids or bases, with elimination of water. Suitable methods for condensation of glycerol are disclosed, for example, by U.S. Pat. No. 7,026,363 B2 and WO 2004/108863 A1.

Glycerol condensates generally comprise 2 to about 50 glycerol units (a=2 to 50). glycerol condensates comprising 2 to 30 glycerol units are preferred. More preferred are glycerol condensates comprising 2 to 10 glycerols and most preferred are compounds (IIa) comprising 2 to 5 glycerols.

A preferred polyalcohol homo-condensate is a glycerol condensate as described by formula (IIb)

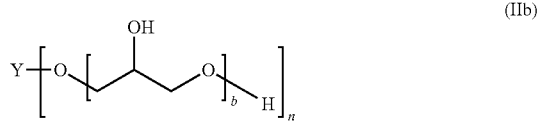

wherein n is an integer from 1 to 6 and Y is an n-valent linear or branched aliphatic or cycloaliphatic radical having from 1 to 10 carbon atoms, which may be substituted or unsubstituted. Y may also referred to as "starter".

b is an integer from 1 to 30, wherein b can be different for each polymer arm n. Preferably b is an integer from 1 to 15. Most preferred are compounds (IIb) wherein b is an integer from 1 to 5.

Optionally, polyglycerol condensates (IIb) can also be obtained by polymerization of glycerol carbonate or glycidol.

Suitable starters for the polymerization reaction are components having one hydroxyl group and/or components having two hydroxyl groups and/or polyalcohols. Suitable components having one hydroxyl group are aliphatic alcohols, such as methanol, ethanol, propanol, and cycloaliphatic alcohols, such as cyclohexanol. Suitable components having two hydroxyl groups are aliphatic diols, such as ethylene glycol, 1,2-propanediol, 1,3-propanediol, 1,4-butanediol, polyalkylene glycol and the like.

In a preferred embodiment, Y is tri(hydroxymethyl)propane, i.e. the glycerol condensate (IIb) is a reaction product of glycerol carbonate and tri(hydroxymethyl)propane. In another preferred embodiment, polyglycerol condensate (IIb) is a reaction product of glycerol carbonate and a pentaerythritol polyethylene glycol oligomer.

Preference is given to undertaking the polymerization of glycerol carbonate in the presence of a customary basic catalyst, for example alkali metal hydroxides, preferably potassium hydroxide, or alkali metal alkoxides, for example, sodium methoxide or potassium tert-butylate. The reaction can be undertaken, in a manner known in principle, at atmospheric pressure under nitrogen at from 100 to 250 degree C., preferably from 120 to 200 degree C. and more preferably from 140 to 180 degree C.

A further preferred polyalcohol homo-condensate is a condensate of pentaerythritol as depicted in formula (IIc).

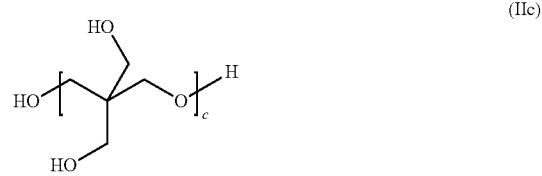

In one preferred embodiment, the polyalcohol condensate (I) is a dimer (c=2) or a trimer (c=3) of pentaerythritol. Dimers and trimers of pentaerythritol are commercially available. Suitable methods for syntheses of pentaerythritol condensates are disclosed, for example, in U.S. Pat. No. 2,441,555.

Preferred polyalcohol co-condenate is a co-condensate of glycerol and a further alcohol having two hydroxyl groups. Suitable alcohols having two hydroxyl groups are aliphatic diols, such as ethylene glycol, 1,2-propanediol, 1,3-propanediol, 1,4-butanediol, polyalkylene glycol such as polyethylene glycol and polypropylene glycol, polyalkylene glycol copolymers such as polyethylene glycol and polypropylene glycol copolymers, and the like. Such copolymers can be synthesized according to the procedures applied for synthesis of (IIa).

A literature overview on the various synthesis procedures for glycerol-comprising polyalcohol condensates is given in WO 2007049950 A2.

A further preferred polyalcohol co-condensate is a condensate of pentaerythritol and a further component having two hydroxyl groups as mentioned above.

To receive the final suppressing agent to be used in the electroplating bath the polyalcohol condensates have to be polyalkoxylated.

Polyalkoxylated polyalcohol condensates are reaction products of polyalcohol condensates and alkylene oxides. Alkoxylated polyalcohol condensates can be observed by reacting the OH groups present in the polyalcohol condensates with alkylene oxides to form terminal polyether groups. Alkoxylated polyalcohol condensates are known per se. For example, in U.S. Pat. No. 7,026,363 B2 the alkoxylation of glycerol condensates by ethylene oxide or propylene oxide has been described.

Generally, suitable alkylene oxides may be C2- to C12-alkylene oxides or styrene oxide. Examples of corresponding alkylene oxides comprise ethylene oxide and propylene oxide and also 1-butene oxide, 2,3-butene oxide, 2-methyl-1,2-propene oxide (isobutene oxide), 1-pentene oxide, 2,3-pentene oxide, 2-methyl-1,2-butene oxide, 3-methyl-1,2-butene oxide, 2,3-hexene oxide, 3,4-hexene oxide, 2-methyl-1,2-pentene oxide, 2-ethyl-1,2-butene oxide, 3-methyl-1,2-pentene oxide, decene oxide, 4-methyl-1,2-pentene oxide or styrene oxide. Preferably the content of ethylene oxide in the copolymer of ethylene oxide and alkylene oxide is from 10 to 90% by weight, more preferably from 10 to 50% by weight, most preferably from 25 to 40% by weight.

Preference is given to using alkylene oxide(s) selected from ethylene oxide, propylene oxide and butylene oxide, or combinations thereof.

More preferably the polyoxyalkylene side chains are copolymers of ethylene oxide with propylene oxide or butylene oxide or propylene oxide and butylene oxide.

Preferably, higher alkylene oxides are generally used, at most, in small amounts for fine adjustment of the properties. In general, the amount of ethylene oxide and/or propylene oxide and/or butylene oxide is at least 80% by weight, preferably at least 90%, most preferably 100% by weight based on the sum of all alkylene oxides used.

Most preferably the alkylene oxide is selected from ethylene oxide and propylene oxide or mixtures thereof. A preferred weight ratio of oxyethylene and oxypropylene units in the final product is 10:90 to 90:10, more preferred is 10:90 to 50:50, most preferred are 25:75 to 40:60.

When two or more different alkylene oxides are used, the polyoxyalkylene groups formed may be random copolymers, alternating copolymers, gradient copolymers or block copolymers. Preferred are random copolymers.

Preferably, the molecular weight $M_w$ of polyalkoxylated polyalcohol condensates is from 500 to 30000 g/mol, more preferred from 1000 to 20000 g/mol, more preferred from 2000 to 15000 g/mol and even more preferred from 3000 to 10000 g/mol. Most preferred is a molecular weight of from 4000 to 8000 g/mol.

The average degree of alkoxylation is from about 10 to about 500, preferably from about 30 to about 400, more preferably from about 50 to about 300, most preferably from about 60 to about 200 alkylene oxide units per polyalcohol condensate.

The synthesis of polyalkylene oxide units is known to those skilled in the art. Comprehensive details are given, for example, in "Polyoxyalkylenes" in Ullmann's Encyclopedia of Industrial Chemistry, 6th Edition, Electronic Release.

Preference is given to undertaking the alkoxylation in the presence of a customary basic catalyst, for example alkali metal hydroxides, preferably potassium hydroxide, or alkali metal alkoxides, for example sodium methoxide or potassium tert-butylate. The alkoxylation can be undertaken, in a manner known in principle, in a pressure reactor at from 40 to 250 degree C., preferably from 80 to 200 degree C. and more preferably from 100 to 150 degree C. For the correct metered addition of the alkylene oxides, it is advisable, before the alkoxylation, to determine the number of OH groups of the polyalcohol condensate (II). When the melting point of polyalcohol condensate (II) exceeds the reaction temperature, the polyalcohol condensate (II) is suspended in an inert solvent before the alkoxylation reaction. Suitable solvents are toluene, xylenes and N,N-dimethylformamide.

The polyalkoxylated polyalcohol condensates may optionally be functionalized in a further reaction step. An additional functionalization can serve to modify the properties of the alkoxylated polyalcohol condensates. The terminal hydroxyl groups of the alkoxylated polyalcohol condensates can be reacted with suitable reagents for functionalization, which forms groups of the general formula -(alkoxy)$_s$-Z where Z is any desired group and s is 1 to 200. According to the functionalizing agent, the chain end can be hydrophobized or more strongly hydrophilized.

The terminal hydroxyl groups can be esterified, for example, with sulfuric acid or derivatives thereof, so as to form products with terminal sulfate groups (sulfatation). Analogously, products having terminal phosphorus groups can be obtained with phosphoric acid, phosphorous acid, polyphosphoric acid, $POCl_3$ or $P_4O_{10}$ (phosphatation).

In addition, the terminal OH groups may also be etherified, so as to form ether-terminated polyalkoxy groups of the general formula -(alkoxy)$_s$-Z, where Z is an alkyl, alkenyl, alkynyl, alkaryl, or aryl group. Preferably, Z is methyl, ethyl, benzyl, acetyl or benzoyl.

A further embodiment of the present invention is the use of a metal plating bath comprising a composition as described above for depositing the metal on substrates comprising features having an aperture size of 30 nanometers or less.

A further embodiment of the present invention is a process for depositing a metal layer on a substrate by
a) contacting a metal plating bath comprising a composition according to the present invention with the substrate, and
b) applying a current density to the substrate for a time sufficient to deposit a metal layer onto the substrate.

Preferably the substrate comprises submicrometer sized features and the deposition is performed to fill the submicrometer sized features. Most preferably the submicrometer-sized features have an (effective) aperture size from 1 to 30 nanometers and/or an aspect ratio of 4 or more. More preferably the features have an aperture size of 25 nanometers or below, most preferably of 20 nanometers or below.

The aperture size according to the present invention means the smallest diameter or free distance of a feature before plating, i.e. after copper seed deposition. The terms "aperture" and "opening" are used herein synonymously. A convex shape is a feature having an aperture size being at least 25%, preferably 30%, most preferably 50% smaller than the biggest diameter or free distance of the feature before plating.

The plating bath according to the present invention is particularly suitable for features having high aspect ratios of 4 or more, particularly of 6 or more.

A wide variety of metal plating baths may be used with the present invention. Metal electroplating baths typically contain a metal ion source, an electrolyte, and a polymeric suppressing agent.

The metal ion source may be any compound capable of releasing metal ions to be deposited in the electroplating bath in sufficient amount, i.e. is at least partially soluble in the electroplating bath. It is preferred that the metal ion source is soluble in the plating bath. Suitable metal ion sources are metal salts and include, but are not limited to, metal sulfates, metal halides, metal acetates, metal nitrates, metal fluoroborates, metal alkylsulfonates, metal arylsulfonates, metal sulfamates, metal gluconates and the like.

It is preferred that the metal is copper. It is further preferred that the source of metal ions is copper sulfate, copper chloride, copper acetate, copper citrate, copper nitrate, copper fluoroborate, copper methane sulfonate, copper phenyl sulfonate and copper p-toluene sulfonate. Copper sulfate pentahydrate and copper methane sulfonate are particularly preferred. Such metal salts are generally commercially available and may be used without further purification.

Besides metal electroplating the compositions may be used in electroless deposition of metal containing layers. The compositions may particularly be used in the deposition of barrier layers containing Ni, Co, Mo, W and/or Re. In this case, besides metal ions, further elements of groups III and V, particularly B and P may be present in the composition for electroless deposition and thus co-deposited with the metals.

The metal ion source may be used in the present invention in any amount that provides sufficient metal ions for electroplating on a substrate. Suitable metal ion sources include, but are not limited to, tin salts, copper salts, and the like. When the metal is copper, the copper salt is typically present in an amount in the range of from about 1 to about 300 g/L of plating solution. It will be appreciated mixtures of metal salts may be electroplated according to the present invention. Thus, alloys, such as copper-tin having up to about 2 percent by weight tin, may be advantageously plated according to the present invention. The amounts of each of the metal salts in such mixtures depend upon the particular alloy to be plated and is well known to those skilled in the art.

In general, besides the metal ion source and at least one of the suppressing agents according to the present invention the present metal electroplating compositions preferably include electrolyte, i. e. acidic or alkaline electrolyte, one or more sources of metal ions, optionally halide ions, and optionally other additives like accelerators and/or levelers. Such baths are typically aqueous. The water may be present in a wide range of amounts. Any type of water may be used, such as distilled, deionized or tap.

The electroplating baths of the present invention may be prepared by combining the components in any order. It is preferred that the inorganic components such as metal salts, water, electrolyte and optional halide ion source, are first added to the bath vessel followed by the organic components such as leveling agents, accelerators, suppressors, surfactants and the like.

Typically, the plating baths of the present invention may be used at any temperature from 10 to 65 degrees C. or higher. It is preferred that the temperature of the plating baths is from 10 to 35 degrees C. and more preferably from 15 degrees to 30 degrees C.

Suitable electrolytes include such as, but not limited to, sulfuric acid, acetic acid, fluoroboric acid, alkylsulfonic acids such as methanesulfonic acid, ethanesulfonic acid, propanesulfonic acid and trifluoromethane sulfonic acid, arylsulfonic acids such as phenyl sulfonic acid and toluenesulfonic acid, sulfamic acid, hydrochloric acid, phosphoric acid, tetraalkylammonium hydroxide, preferably tetramethylammonium hydroxide, sodium hydroxide, potassium hydroxide and the like. Acids are typically present in an amount in the range of from about 1 to about 300 g/l, alkaline electrolytes are typically present in an amount of about 0.1 to about 20 g/l or to yield a pH of 8 to 13 respectively, and more typically to yield a pH of 9 to 12.

Such electrolytes may optionally contain a source of halide ions, such as chloride ions as in copper chloride or hydrochloric acid. A wide range of halide ion concentrations may be used in the present invention such as from about 0 to about 500 ppm. Typically, the halide ion concentration is in the range of from about 10 to about 100 ppm based on the plating bath. It is preferred that the electrolyte is sulfuric acid or methanesulfonic acid, and preferably a mixture of sulfuric acid or methanesulfonic acid and a source of chloride ions. The acids and sources of halide ions useful in the present invention are generally commercially available and may be used without further purification.

Preferably the composition further comprises at least one accelerating agent and/or at least one leveling agent.

Any accelerating agents (also often referred to as accelerators) may be advantageously used in the plating baths according to the present invention. Accelerators useful in the present invention include, but are not limited to, compounds comprising one or more sulfur atom and a sulfonic/phosphonic acid or their salts.

The generally preferred accelerators have the general structure $MO_3X—R^{21}—(S)_p—R^{22}$, with:

M is a hydrogen or an alkali metal (preferably Na or K)
X is P or S
p=1 to 6
$R^{21}$ is selected from C1-C8 alkyl group or heteroalkyl group, an aryl group or a heteroaromatic group. Heteroalkyl groups will have one or more heteroatom (N, S, O) and 1-12 carbons. Carbocyclic aryl groups are typical aryl groups, such as phenyl, naphtyl. Heteroaromatic groups are also suitable aryl groups and contain one or more N, O or S atom and 1-3 separate or fused rings.
$R^{22}$ is selected from H or ($—S—R^{21'}XO_3M$), with $R^{21'}$ being identical or different from $R^{21}$.

More specifically, useful accelerators include those of the following formulae:

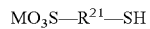

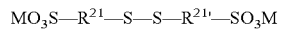

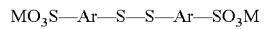

with $R^{21}$ and $R^{21'}$ are as defined above and Ar is Aryl.
Particularly preferred accelerating agents are:
SPS: bis-(3-sulfopropyl)-disulfide disodium salt
MPS: 3-mercapto-1-propansulfonic acid, sodium salt Other examples of accelerators, used alone or in mixture, include, but are not limited to: MES (2-Mercaptoethanesulfonic acid, sodium salt); DPS (N,N-dimethyldithiocarbamic acid (3-sulfopropylester), sodium salt); UPS (3-[(aminoiminomethyl)-thio]-1-propylsulfonic acid); ZPS (3-(2-benzthiazolylthio)-1propanesulfonic acid, sodium salt); 3-mercapto-propylsulfonicacid-(3-sulfopropyl)ester; methyl-(ω-sulfopropyl)-disulfide, disodium salt; methyl-(ω-sulfopropyl)-trisulfide, disodium salt.

Such accelerators are typically used in an amount of about 0.1 ppm to about 3000 ppm, based on the total weight of the plating bath. Particularly suitable amounts of accelerator useful in the present invention are 1 to 500 ppm, and more particularly 2 to 100 ppm.

Any additional suppressor may be advantageously used in the present invention. Suppressors useful in the present invention include, but are not limited to, polymeric materials, particularly those having heteroatom substitution, and more particularly oxygen substitution. Suitable suppressors include polyethylene glycol copolymers, particularly polyethylene glycol polypropylene glycol copolymers. The arrangement of ethylene oxide and propylene oxide of suitable suppressors may be block, alternating, gradient, or random. The polyalkylene glycol may comprise further alkylene oxide building blocks such as butylene oxide. Preferably, the average molecular weight of suitable suppressors exceeds about 2000 g/mol. The starting molecules of suitable polyalkylene glycol may be alkyl alcohols such as methanol, ethanol, propanol, n-butanol and the like, aryl alcohols such as phenols and bisphenols, alkaryl alcohols such as benzyl alcohol, polyol starters such as glycol, glycerin, trimethylol propane, pentaerythritol, sorbitol, carbohydrates such as saccharose, and the like, amines and oligoamines such as alkyl amines, aryl amines such as aniline, triethanol amine, ethylene diamine, and the like, amides, lactams, heterocyclic amines such as imidazol and carboxylic acids. Optionally, polyalkylene glycol suppressors may be functionalized by ionic groups such as sulfate, sulfonate, ammonium, and the like.

When suppressors are used, they are typically present in an amount in the range of from about 1 to about 10,000 ppm based on the weight of the bath, and preferably from about 5 to about 10,000 ppm.

Leveling agents can advantageously be used in the metal plating baths according to the present invention. The terms "leveling agent" and "leveler" are used herein synonymously.

Suitable leveling agents include, but are not limited to, one or more of polyethylene imine and derivatives thereof, quaternized polyethylene imine, polyglycine, poly(allylamine), polyaniline, polyurea, polyacrylamide, poly(melamine-co-formaldehyde), reaction products of amines with epichlorohydrin, reaction products of an amine, epichlorohydrin, and polyalkylene oxide, reaction products of an amine with a polyepoxide, polyvinylpyridine, polyvinylimidazole, polyvinylpyrrolidone, or copolymers thereof, nigrosines, pentamethyl-para-rosaniline hydrohalide, hexamethyl-pararosaniline hydrohalide, trialkanolamines and their derivatives or compounds containing a functional group of the formula N—R—S, where R is a substituted alkyl, unsubstituted alkyl, substituted aryl or unsubstituted aryl. Typically, the alkyl groups are (C1-C6)alkyl and preferably (C1-C4)alkyl. In general, the aryl groups include (C6-C20)aryl, preferably (C6-C10)aryl. Such aryl groups may further include heteroatoms, such as sulfur, nitrogen and oxygen. It is preferred that the aryl group is phenyl or napthyl. The compounds containing a functional group of the formula N—R—S are generally known, are generally commercially available and may be used without further purification.

In such compounds containing the N—R—S functional group, the sulfur ("S") and/or the nitrogen ("N") may be attached to such compounds with single or double bonds. When the sulfur is attached to such compounds with a single bond, the sulfur will have another substituent group, such as but not limited to hydrogen, (C1-C12)alkyl, (C2-C12)alkenyl, (C6-C20)aryl, (C1-C12)alkylthio, (C2-C12)alkenylthio, (C6-C20)arylthio and the like. Likewise, the nitrogen will have one or more substituent groups, such as but not limited to hydrogen, (C1-C12)alkyl, (C2-C12)alkenyl, (C7-C10)aryl, and the like. The N—R—S functional group may be acyclic or cyclic. Compounds containing cyclic N—R—S functional groups include those having either the nitrogen or the sulfur or both the nitrogen and the sulfur within the ring system.

By "substituted alkyl" is meant that one or more of the hydrogens on the alkyl group is replaced with another substituent group, such as, but not limited to, cyano, hydroxyl, halo, (C1-C6)alkoxy, (C1-C6)alkylthio, thiol, nitro, and the like. By "substituted aryl" is meant that one or more hydrogens on the aryl ring are replaced with one or more substituent groups, such as, but not limited to, cyano, hydroxyl, halo, (C1-C6)alkoxy, (C1-C6)alkyl, (C2-C6)alkenyl, (C1-C6)alkylthio, thiol, nitro, and the like. "Aryl" includes carbocyclic and heterocyclic aromatic systems, such as, but not limited to, phenyl, naphthyl and the like.

Polyalkanolamines, alkoxylated polyalkanolamines, functionalized polyalkanolamines, and functionalized alkoxylated polyalkanolamines are particularly preferred levelling agents in copper electroplating baths. Such Polyalkanolamines are described in European patent application No. 08172330.6, which is incorporated herein by reference.

Polyalkanolamines can be obtained by condensing at least one trialkanolamine of the general formula $N(R^{11}—OH)_3$ (XIa and/or at least one dialkanolamine of the general formula $R^{12}—N(R^{11}—OH)_2$ (XIb) to give a polyalkanolamine (XII) (stage A), wherein the $R^{11}$ radicals are each independently selected from a divalent, linear and branched aliphatic hydrocarbon radical having from 2 to 6 carbon atoms, and the $R^{12}$ radicals are each independently selected from hydrogen and aliphatic, cycloaliphatic and aromatic hydrocarbon radicals, all of which may be linear or branched, having from 1 to 30 carbon atoms.

The alkanolamine can be used as such or may optionally be alkoxylated, functionalized or alkoxylated and functionalized to get alkoxylated polyalkanolamines (XIII), functionalized polyalkanolamines (XIV) or functionalized alkoxylated polyalkanolamines (XV).

Alkoxylated polyalkanolamines (XIII) can be obtained by alkoxylating polyalkanolamine (XII) with $C_2$- to $C_{12}$-alkylene oxides, styrene oxide, glycidol, or glycidyl ethers with the proviso that the average degree of alkoxylation is from 0.1 to 200 per OH group and—where present—secondary amino group (stage B).

Functionalized polyalkanolamines (XIV) can be obtained by functionalizing polyalkanolamine (XII) with suitable functionalization reagents which are capable of reaction with hydroxyl groups and/or amino groups (stage C).

Functionalized alkoxylated polyalkanolamines (XV) can be obtained by functionalizing alkoxylated polyalkanolamine (XIII) with suitable functionalization reagents which are capable of reaction with hydroxyl groups and/or amino groups (stage D).

The trialkanolamines (XIa) and/or dialkanolamines (XIb) used in stage (A) have the general formulae $N(R^{11}—OH)_3$ (XIa) and $R^{12}—N(R^{11}—OH)_2$ (XIb).

The $R^{11}$ radicals are in each case independently a divalent linear or branched aliphatic hydrocarbon radical having from 2 to 6 carbon atoms, preferably 2 or 3 carbon atoms. Examples of such radicals comprise ethane-1,2-diyl, propane-1,3-diyl, propane-1,2-diyl, 2-methylpropane-1,2-diyl, 2,2-dimethylpropane-1,3-diyl, butane-1,4-diyl, butane-1,3-diyl (=1-methylpropane-1,3-diyl), butane-1,2-diyl, butane-2,3-diyl, 2-methylbutane-1,3-diyl, 3-methylbutane-1,3-diyl (=1,1-dimethylpropane-1,3-diyl), pentane-1,4-diyl, pentane-1,5-diyl, pentane-2,5-diyl, 2-methylpentane-2,5-diyl (=1,1-dimethylbutane-1,3-diyl) and hexane-1,6-diyl. The radicals are preferably ethane-1,2-diyl, propane-1,3-diyl or propane-1,2-diyl.

The $R^{12}$ radical is hydrogen and/or linear or branched aliphatic, cycloaliphatic and/or aromatic hydrocarbon radicals having from 1 to 30 carbon atoms, preferably from 1 to 20 carbon atoms and more preferably from 1 to 10 carbon atoms. Aromatic radicals may of course also have aliphatic substituents. $R^{12}$ is preferably hydrogen or aliphatic hydrocarbon radicals having from 1 to 4 carbon atoms.

Examples of preferred trialkanolamines (XIa) comprise triethanolamine, triisopropanolamine and tributan-2-olamine, particular preference is given to triethanolamine.

Examples of preferred dialkanolamines (XIb) comprise diethanolamine, N-methyl-diethanolamine, N,N-bis(2-hydroxypropyl)-N-methylamine, N,N-bis(2-hydroxybutyl)-N-methylamine, N-isopropyldiethanolamine, N-n-butyldiethanolamine, N-sec-butyldiethanolamine, N-cyclohexyldiethanolamine, N-benzyldiethanolamine, N-4-tolyldiethanolamine or N,N-bis(2-hydroxyethyl)aniline. Particular preference is given to diethanolamine.

In addition to the trialkanolamines (XIa) and/or dialkanolamines (XIb) it is optionally possible to use further components (XIc) having two hydroxyl and/or amino groups for the polycondensation.

The polycondensation of components (XIa) and/or (XIb) and optionally (XIc) can be carried out by methods known in principle to those skilled in the art while heating the components, with elimination of water. Suitable methods are disclosed, for example, by EP 441 198 A2. It will be appreciated that it is in each case also possible to use mixtures of different components (XIa), (XIb) or (XIc).

The condensation is performed typically at temperatures of from 120 to 280 degree C., preferably from 150 to 260 degree C. and more preferably from 180 to 240 degree C. The water formed is preferably distilled off. The reaction time is typically from 1 to 16 h, preferably from 2 to 8 h. The degree of condensation can be controlled in a simple manner through the reaction temperature and time.

The polycondensation is preferably carried out in the presence of an acid, preferably phosphorous acid ($H_3PO_3$) and/or hypophosphorous acid ($H_3PO_2$). Preferred amounts are from 0.05 to 2% by weight, preferably from 0.1 to 1% by weight, based on the components to be condensed. In addition to the acid, it is also possible to use additional catalysts, for example, zinc halides or aluminum sulfate, if appropriate in a mixture with acetic acid, as disclosed, for example by U.S. Pat. No. 4,505,839.

The viscosity of the resulting polyalkanolamines (XII) is typically in the range from 1000 to 50 000 mPa·s, preferably from 2000 to 20 000 mPa·s and more preferably from 3000 to 13000 mPa·s (each measured on the undiluted product at 20 degree C.).

The mean molar mass $M_n$ (number average) of the resulting polyalkanolamines (XII) is typically in the range from 250 to 50 000 g/mole, preferably from 500 to 40 000 g/mole, more preferably from 1000 to 20 000 g/mole and most preferably from 1000 to 7500 g/mole.

The mean molar mass $M_w$ (weight average) of the resulting polyalkanolamines (XII) is typically in the range from 250 to 50 000 g/mole, preferably from 500 to 30 000 g/mole, more preferably from 1000 to 20 000 g/mole.

The resulting polyalkanolamine (XII) preferably has a polydispersity ($M_w/M_n$) in the range of 1 to 10, and in particular in the range of 1 to 5.

The polyalkanolamines (XII) can optionally be alkoxylated in a second stage (B). In this step, the OH groups and any secondary amino groups present react with alkylene oxides to form terminal polyether groups.

Polyalkanolamines (XII) can optionally be functionalized in a further reaction step (C). An additional functionalization can serve to modify the properties of the polyalkanolamines (XII). To this end, the hydroxyl groups and/or amino groups present in the polyalkanolamines (II) are converted by means of suitable agents which are capable of reaction with hydroxyl groups and/or amino groups. This forms functionalized polyalkanolamines (XIV).

The alkoxylated polyalkanolamines (XIII) can optionally be functionalized in a further reaction step (D). An additional functionalization can serve to modify the properties of the alkoxylated polyalkanolamines (XIII). To this end, the hydroxyl groups and/or amino groups present in the alkoxylated polyalkanolamines (XIII) are converted by means of suitable agents which are capable of reaction with hydroxyl groups and/or amino groups. This forms functionalized alkoxylated polyalkanolamines (XV).

In general, the total amount of leveling agents in the electroplating bath is from 0.5 ppm to 10000 ppm based on the total weight of the plating bath. The leveling agents according to the present invention are typically used in a total amount of from about 0.1 ppm to about 1000 ppm based on the total weight of the plating bath and more typically from 1 to 100 ppm, although greater or lesser amounts may be used. The electroplating baths according to the present invention may include one or more optional components. Such optional additives include, but are not limited to, accelerators, suppressors, surfactants and the like. Such suppressors and accelerators are generally known in the art. It will be clear to one skilled in the art which suppressors and/or accelerators to use and in what amounts.

A large variety of additives may typically be used in the bath to provide desired surface finishes for the Cu plated metal. Usually more than one additive is used with each additive forming a desired function. Advantageously, the electroplating baths may contain one or more of accelerators, levelers, sources of halide ions, grain refiners and mixtures thereof. Most preferably the electroplating bath contains both, an accelerator and a leveler in addition to the suppressor according to the present invention. Other additives may also be suitably used in the present electroplating baths.

The present invention is useful for depositing a metal layer, particularly a copper layer, on a variety of substrates, particularly those having submicron and variously sized apertures. For example, the present invention is particularly suitable for depositing copper on integrated circuit substrates, such as semiconductor devices, with small diameter vias, trenches or other apertures. In one embodiment, semiconductor devices are plated according to the present invention. Such semiconductor devices include, but are not limited to, wafers used in the manufacture of integrated circuits.

The general process of copper electrodeposition on semiconductor integrated circuit substrates is described with respect to FIGS. 1 and 2 without restricting the invention thereto.

Figure 1B:
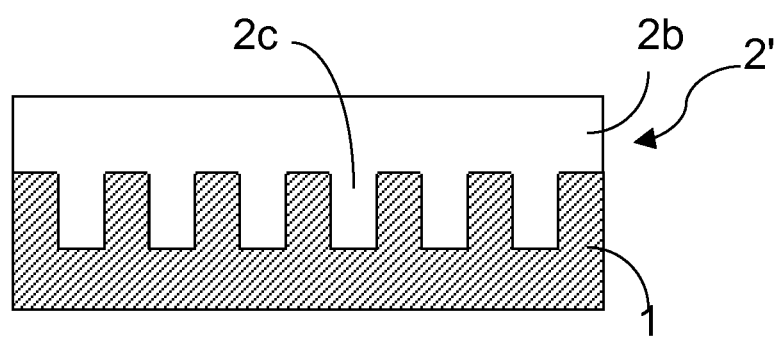
With reference to FIG. 1b a copper layer 2' is deposited onto the dielectric substrate 1 by electrodeposition. The trenches 2c of the substrate 1 are filled and an overplating of copper 2b, also referred to as "overburden", is generated on top of the whole structured substrate. During the process, after optional annealing, the overburden of copper 2b is removed by chemical mechanical planarization (CMP), as depicted in FIG. 1c.
Figure 1C:
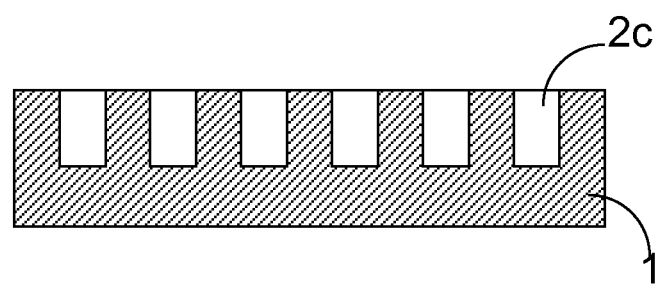

FIG. 1a shows a dielectric substrate 1 seeded with a copper layer 2a. With reference to FIG. 1b a copper layer 2' is deposited onto the dielectric substrate 1 by electrodeposition. The trenches 2c of the substrate 1 are filled and an overplating of copper 2b, also referred to as "overburden", is generated on top of the whole structured substrate. During the process, after optional annealing, the overburden of copper 2b is removed by chemical mechanical planarization (CMP), as depicted in FIG. 1c.

Figure 2A:
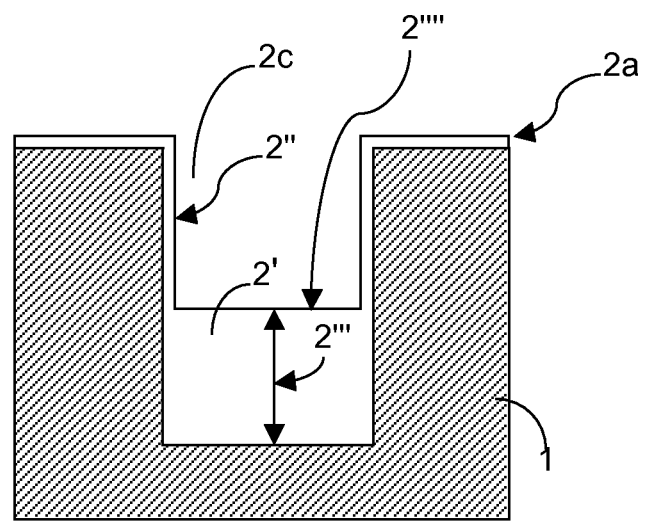
FIGS. 2a, 2b and 2c show trench filling, i.e., super-filling or bottom-up-filling.

A key aspect when filling the trenches 2c of the substrate 1 with copper by electrodeposition is to achieve a copper layer that is free of defects, especially free of voids and seams. This can be realized by initiating the copper growth at the bottom of the trench with the copper growing up to the mouth of the trench while suppressing copper growth at the sidewalls of the trench. This manner of trench filling, the so-called super-filling or bottom-up-filling, depicted in FIG. 2a, is sought to achieve by adding certain additives to the plating bath: the accelerator and the suppressor. It is a sensitive interplay between these two additives that has to be carefully adjusted to obtain a trench filling free of any defects.

Figure 2B:
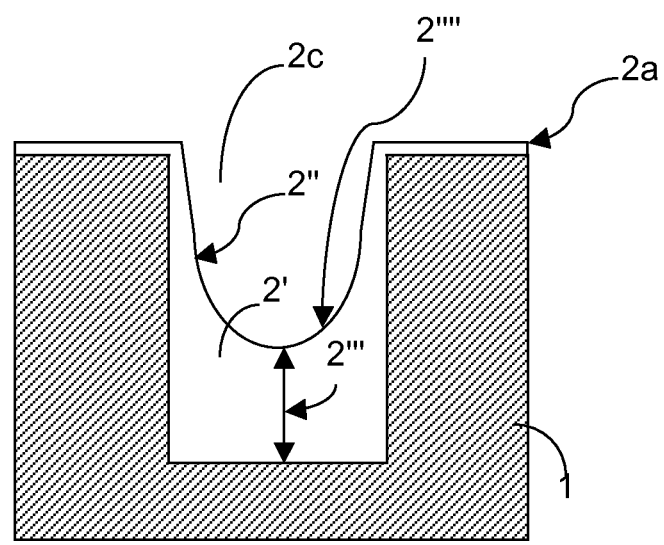
Figure 2C:
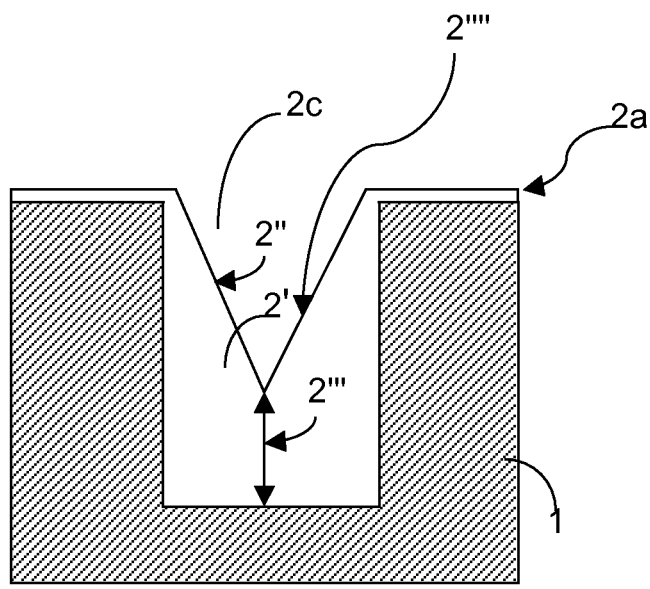
Figure 3:
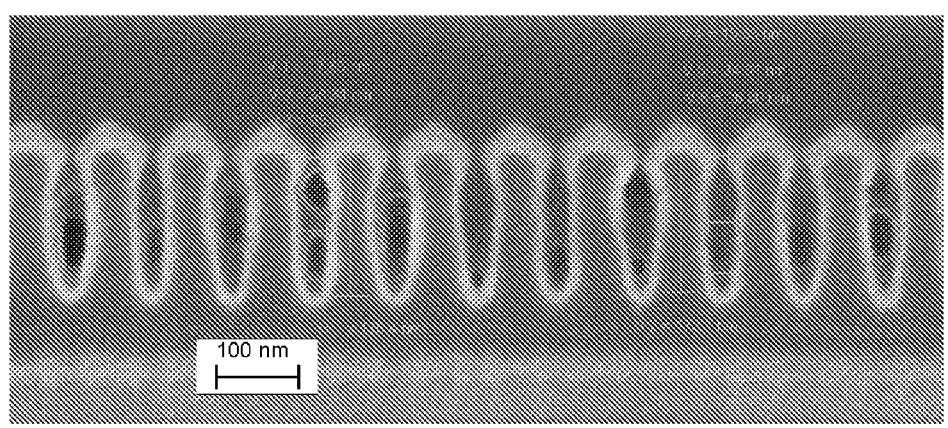
FIG. 3: shows an increasing seed overhang issue and/or convex-shaped features with further shrinking feature sizes.

Bottom-up-filling as shown in FIG. 2a can be achieved with the accelerator preferably accumulating and adsorbing on the copper bottom of the trench and thus boosting the copper growth 2''', and with the suppressor adsorbing on the sidewalls of the trench suppressing the copper growth 2''. Depending on the chemical structure of the suppressor and thus on its suppressing ability, the trench filling can proceed with variably shaped copper growth fronts 2'''', depicted in FIGS. 2a to 2c. A perfectly working suppressor with complete sidewall coverage and full sidewall growth suppression 2'' is shown in FIG. 2a. In this case the growth front 2'''' is flat with solely growing bottom-up copper 2'''. A less effective suppressor results in a copper growth front 2'''' depicted in FIG. 2b. Slight sidewall copper growth 2'' with predominant bottom-up copper growth 2''' gives an overall U-shaped growth front 2''''. A weak suppressor evolves a V-shaped growth front 2'''' due to significant sidewall copper growth 2'', as depicted in FIG. 2c. A V-shaped copper growth front 2'''' implicates a serious risk of void formation when the trench is filled. With a perfectly conformal copper seeded trench the U-shaped copper growth front 2'''' as shown in FIG. 2b might provide satisfying trench filling. But since there is an increasing seed overhang issue and/or convex-shaped features with further shrinking feature sizes, as depicted in FIG. 3, there is a serious risk of pinch-off void formation in the upper half of the trench close to the opening if the suppressor does not completely avoid sidewall copper growth 2''. The present invention provides a new class of highly effective, strong suppressing agents that cope with the seed overhang issue and provide defect free trench filling despite a non-conformal copper seed.

The advantage of the invention is that suppressing agents are provided that result in an extraordinarily pronounced bottom-up fill copper growth while perfectly suppressing the sidewall copper growth, both leading to a flat growth front and thus providing defect free trench fill. The strong sidewall copper growth suppression of the invention enables non-conformal copper seeded features and/or convex-shaped features to be substantially void free filled. Moreover the invention provides an overall homogeneous bottom-up fill in neighboring features of dense feature areas.

The suppressing agents according to the present invention can further advantageous be used as additive in electroplating trough silicon vias (TSV). Such vias normally have dimensions of several micrometers to several hundred micrometers and large aspect ratios of at least 4, sometimes above 10.

Typically, substrates are electroplated by contacting the substrate with the plating baths of the present invention. The substrate typically functions as the cathode. The plating bath contains an anode, which may be soluble or insoluble. Optionally, cathode and anode may be separated by a membrane. Potential is typically applied to the cathode. Sufficient current density is applied and plating performed for a period of time sufficient to deposit a metal layer, such as a copper layer, having a desired thickness on the substrate. Suitable current densities include, but are not limited to, the range of 1 to 250 mA/cm$^2$. Typically, the current density is in the range of 1 to 60 mA/cm$^2$ when used to deposit copper in the manufacture of integrated circuits. The specific current density depends on the substrate to be plated, the leveling agent selected and the like. Such current density choice is within the abilities of those skilled in the art. The applied current may be a direct current (DC), a pulse current (PC), a pulse reverse current (PRC) or other suitable current.

In general, when the present invention is used to deposit metal on a substrate such as a wafer used in the manufacture of an integrated circuit, the plating baths are agitated during use. Any suitable agitation method may be used with the present invention and such methods are well-known in the art. Suitable agitation methods include, but are not limited to, inert gas or air sparging, work piece agitation, impingement and the like. Such methods are known to those skilled in the art. When the present invention is used to plate an integrated circuit substrate, such as a wafer, the wafer may be rotated such as from 1 to 150 RPM and the plating solution contacts the rotating wafer, such as by pumping or spraying. In the alternative, the wafer need not be rotated where the flow of the plating bath is sufficient to provide the desired metal deposit.

Metal, particularly copper, is deposited in apertures according to the present invention without substantially forming voids within the metal deposit. By the term "without substantially forming voids", it is meant that 95% of the plated apertures are void-free. It is preferred that 98% of the plated apertures are void-free, mostly preferred is that all plated apertures are void-free.

While the process of the present invention has been generally described with reference to semiconductor manufacture, it will be appreciated that the present invention may be useful in any electrolytic process where metal filled small features that are substantially free of voids are desired. Such processes include printed wiring board manufacture. For example, the present plating baths may be useful for the plating of vias, pads or traces on a printed wiring board, as well as for bump plating on wafers. Other suitable processes include packaging and interconnect manufacture. Accordingly, suitable substrates include lead frames, interconnects, printed wiring boards, and the like.

Plating equipment for plating semiconductor substrates are well known. Plating equipment comprises an electroplating tank which holds Cu electrolyte and which is made of a suitable material such as plastic or other material inert to the electrolytic plating solution. The tank may be cylindrical, especially for wafer plating. A cathode is horizontally disposed at the upper part of tank and may be any type substrate such as a silicon wafer having openings such as trenches and vias. The wafer substrate is typically coated with a seed layer of Cu or other metal or a metal containing layer to initiate plating thereon. A Cu seed layer may be applied by chemical vapor deposition (CVD), physical vapor deposition (PVD), or the like. An anode is also preferably circular for wafer plating and is horizontally disposed at the lower part of tank forming a space between the anode and cathode. The anode is typically a soluble anode.

These bath additives are useful in combination with membrane technology being developed by various tool manufacturers. In this system, the anode may be isolated from the organic bath additives by a membrane. The purpose of the separation of the anode and the organic bath additives is to minimize the oxidation of the organic bath additives.

The cathode substrate and anode are electrically connected by wiring and, respectively, to a rectifier (power supply). The cathode substrate for direct or pulse current has a net negative charge so that Cu ions in the solution are reduced at the cathode substrate forming plated Cu metal on the cathode surface. An oxidation reaction takes place at the anode. The cathode and anode may be horizontally or vertically disposed in the tank.

Metal, particularly copper, is deposited in apertures according to the present invention without substantially forming voids within the metal deposit. By the term "without substantially forming voids", it is meant that 95% of the plated apertures are void-free. It is preferred that the plated apertures are void-free.

While the process of the present invention has been generally described with reference to semiconductor manufacture, it will be appreciated that the present invention may be useful in any electrolytic process where a substantially void-free copper deposit is desired. Accordingly, suitable substrates include lead frames, interconnects, printed wiring boards, and the like.

All percent, ppm or comparable values refer to the weight with respect to the total weight of the respective composition except where otherwise indicated. All cited documents are incorporated herein by reference.

The following examples shall further illustrate the present invention without restricting the scope of this invention.

EXAMPLES

Three types of EO-PO copolymers have been synthesized by polyalkoxylation of the respective polyalcohol condensates.

The hydroxyl number was determined according to DIN 53240 by heating the sample in pyridine with acetic acid anhydride and acetic acid, followed by titration with potassium hydroxide.

The molecular weight distribution was determined by size exclusion chromatography (GPC) with THF as eluent and using PSS SDV columns as solid phase.

EXAMPLE 1

A mixture of pentaerythritol ethoxylate (CAS-Nr.: 30599-15-6, supplier: Aldrich, Ohio number 14.5 mmol/g, 40.0 g) and potassium tert-butylate (0.80 g) was heated at 160° C. with stirring under a weak stream of nitrogen. After 30 min glycerol carbonate (68.5 g) was added dropwise over a period of 45 min and the formation of $CO_2$ was detected by a bubble counter. The reaction was stirred for additional 4.5 h and, subsequently, cooled to room temperature. A brown, highly viscous liquid (79.5 g) having a hydroxyl number of 784.7 mg KOH/g was obtained. The IR spectrum of L1720 did not exhibit any signal in the range of 1600-1900 $cm^{-1}$, indicating the complete conversion of glycerol carbonate.

The product (74.0 g) and additional potassium tert-butylate (0.2 g) were placed into a 2 L autoclave and heated at 130° C. under nitrogen at 2 bar. After 1 h a mixture of ethylene oxide (251.1 g) and propylene oxide (585.8 g) were added in portions at 130° C. over a period of 4 h 10 min. To complete the reaction, the mixture was allowed to post-react for 15 h at 7 bar. The reaction mixture was stripped with nitrogen and volatile compounds were removed in vacuo at 80° C. A clear yellow oil (896.5 g) having a hydroxyl number of 70.0 mg KOH/g was obtained. The molecular weight distribution was determined by size exclusion chromatography (SEC). Polydispersity: $_Mw/M_n=1.39$.

EXAMPLE 2

A mixture of tri(hydroxymethyl)propane (50.0 g) and potassium tert-butylate (2.1 g) was heated at 160° C. with stirring under a weak stream of nitrogen. After 1 h glycerol carbonate (118 g) was added dropwise over a period of 45 min and the formation of $CO_2$ was detected by a bubble counter. The reaction was stirred for additional 16 h and, subsequently, cooled to room temperature. The product (182 g) exhibited a hydroxyl number of 1042 mg KOH/g. The IR spectrum of L1727 did not exhibit any signal in the range of 1600-1900 $cm^{-1}$, indicating the complete polymerization of glycerol carbonate.

The product (70.0 g) and additional potassium tert-butylate (0.6 g) were placed into a 2 L autoclave and heated at 130° C. under nitrogen at 2 bar. After 1 h a mixture of ethylene oxide (386.7 g) and propylene oxide (902.4 g) were added in portions at 130° C. over a period of 4 h 10 min. To complete the reaction, the mixture was allowed to post-react for 15 h at 7 bar. The reaction mixture was stripped with nitrogen and volatile compounds were removed in vacuo at 80° C. A slightly cloudy yellow-brown oil (1295 g) having a hydroxyl number of 58.3 mg KOH/g was obtained. The molecular weight distribution was determined by size exclusion chromatography (SEC). Polydispersity: $M_w/M_n=1.32$.

EXAMPLE 3

A pentaerythritol trimer condensate (CAS: 78-24-0, supplier: Aldrich, 45 g), xylene (150 ml) and potassium tert-butylate (0.8 g) were placed into a 2 L autoclave and heated at 130° C. under nitrogen at 2.5 bar. After 3 h a mixture of ethylene oxide (235.8 g) and propylene oxide (550.4 g) were added in portions at 130° C. over a period of 4 h 10 min. To complete the reaction, the mixture was allowed to post-react for 15 h at 7 bar. The solvent was removed at the rotary evaporator at 100° C. and under vacuo. A cloudy yellow oil was observed which was filtered to remove slight amounts of a solid impurity. The remaining clear yellow oil exhibited a hydroxyl number of 73.7 mg KOH/g. The molecular weight distribution was determined by size exclusion chromatography (SEC). Polydispersity: $M_w/M_n=1.18$.

FIG. 3 shows the feature sizes of the copper seeded wafer substrate that was used for electroplating with the different plating baths described in the following sections. After copper seed deposition the trenches had a width of 15.6 to 17.9 nanometer at the trench opening, a width of 34.6 to 36.8 nanometer at half height of the trench, and were 176.4 nanometer deep.

EXAMPLE 4

A plating bath was prepared by combining DI water, 40 g/l copper as copper sulfate, 10 g/l sulfuric acid, 0.050 g/l chloride ion as HCl, 0.028 g/l of SPS and 3.00 ml/l of a 4.7 wt % solution in DI water of suppressor 1 as prepared in example 1.

A copper layer was electroplated onto a wafer substrate with feature sizes shown in FIG. 3 provided with a copper seed layer by contacting the wafer substrate with the above described plating bath at 25 degrees C. applying a direct current of −5 $mA/cm^2$ for 3 s or 6 s respectively. The thus electroplated copper layer was cross-sectioned and investigated by scanning electron micrograph (SEM) inspection.

Figure 4A:
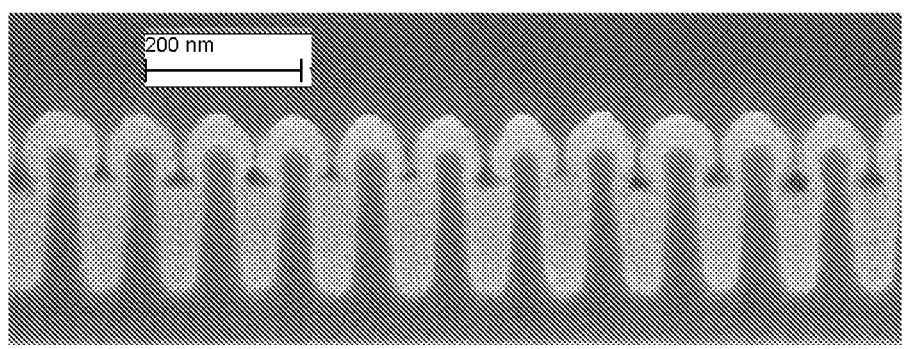
FIGS. 4a and 4b show the SEM images of the resulting electroplated copper layers.
Figure 4B:
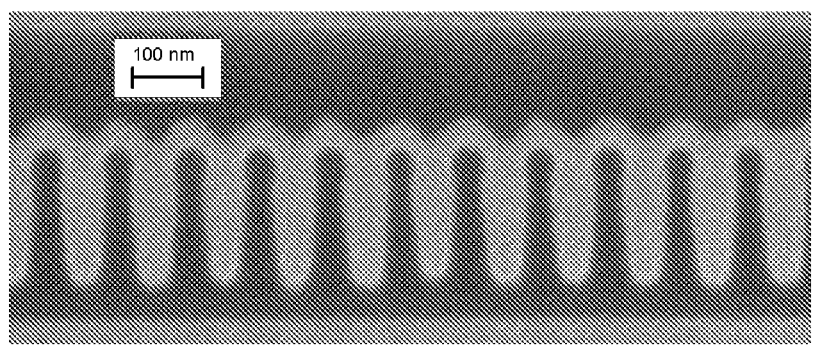

FIGS. 4a and 4b show the SEM images of the resulting electroplated copper layers. FIG. 4a exhibits partially filled trenches without any voids or seams after 3 s plating, and a flat copper growth front in the trenches can be seen clearly indicating the bottom-up filling which is idealized shown in FIG. 2a. The copper deposition on the sidewalls of the trenches was negligible small showing the strong suppression of the copper growth at the sidewalls of the trenches. All feature openings are still open. After 6 s plating all trenches are completely and defect free filled exhibiting an overall homogeneous growth front as shown in FIG. 4b.

EXAMPLE 5

A plating bath was prepared by combining DI water, 40 g/l copper as copper sulfate, 10 g/l sulfuric acid, 0.050 g/l chloride ion as HCl, 0.028 g/l of SPS and 3.00 ml/l of a 4.6 wt % solution in DI water of suppressor 2 as prepared in example 2.

A copper layer was electroplated onto a wafer substrate with feature sizes shown in FIG. 3 provided with a copper seed layer by contacting the wafer substrate with the above described plating bath at 25 degrees C. applying a direct current of −5 mA/cm$^2$ for 3 s or 6 s respectively. The thus electroplated copper layer was cross-sectioned and investigated by SEM inspection.

Figure 5A:
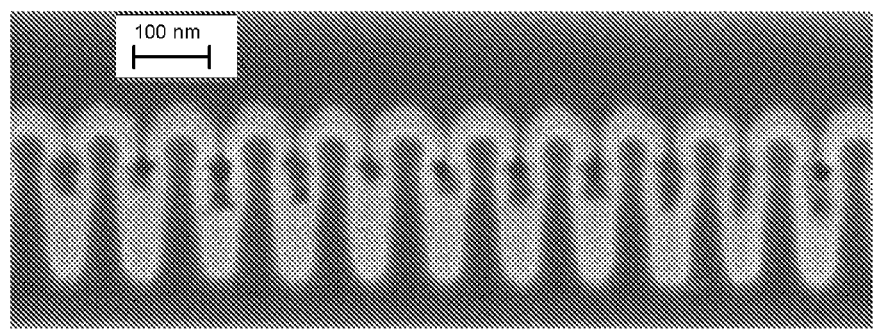
FIGS. 5a and 5b show results of cross-sectioning electroplated copper layer and investigation by SEM inspection.
Figure 5B:
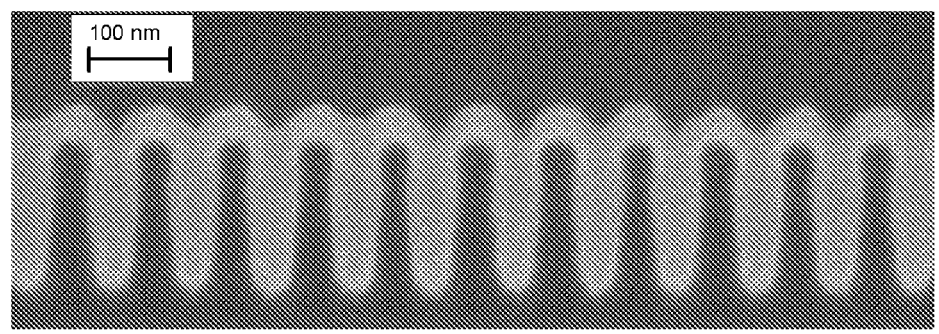

The results are shown in FIGS. 5a and 5b. 3 s plating as shown in FIG. 5a provided partially filled features that resemble the situation depicted in FIG. 2b with little copper deposition on the feature sidewalls next to the bottom growth front yielding an overall U-shape like growth front. The suppressor used in this example is overall more suppressing than the one applied in example 4 thus resulting in a slower filling rate after 3 s. Nevertheless, after 6 s plating completely and defect free filled trenches were provided with an overall homogeneous growth front as shown in FIG. 5b.

EXAMPLE 6

A plating bath was prepared by combining DI water, 40 g/l copper as copper sulfate, 10 g/l sulfuric acid, 0.050 g/l chloride ion as HCl, 0.028 g/l of SPS, and 2.50 ml/l of a 4.9 wt % solution in DI water of suppressor 3 as prepared in example 3.

A copper layer was electroplated onto a wafer substrate with feature sizes shown in FIG. 3 provided with a copper seed layer by contacting the wafer substrate with the above described plating bath at 25 degrees C. applying a direct current of −5 mA/cm$^2$ for 3 s or 6 s respectively. The thus electroplated copper layer was cross-sectioned and investigated by SEM inspection.

Figure 6A:
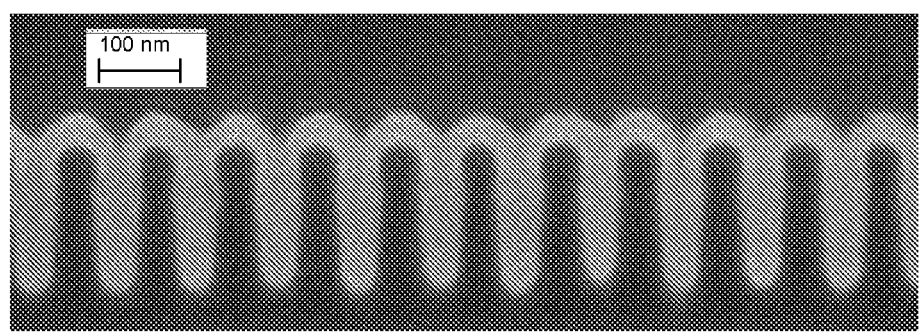
FIGS. 6a and 6b show the SEM images of electroplated copper layers.
Figure 6B:
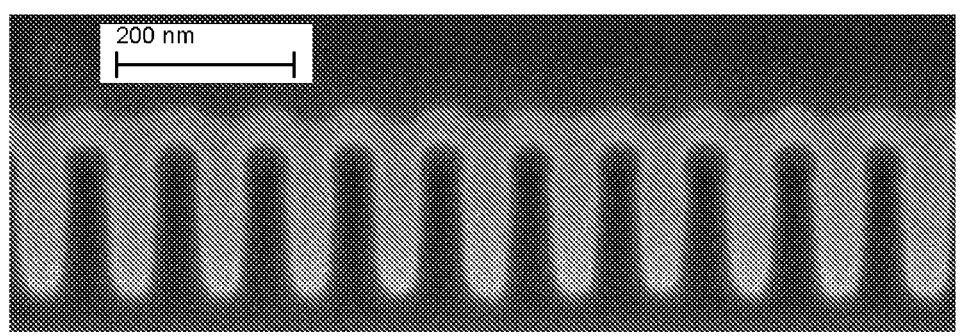

FIGS. 6a and 6b show the SEM images of the resulting electroplated copper layers. The suppressor used in this example provided the fastest filling rate of all suppressors tested in this study while exhibiting sufficient suppressing efficiency to yield defect free gapfill as shown in FIGS. 6a and 6b. After 3 s plating provided in FIG. 6a the features were already filled.

The invention claimed is:
1. A composition, comprising:
a copper ion source and
at least one suppressing agent produced by a process comprising reacting:
a) a polyhydric alcohol condensate starter, which is a condensation derivative of a polyalcohol of the formula

$X(OH)_m$ with
b) an alkylene oxide,
to produce a polyhydric alcohol condensate comprising polyoxyalkylene side chains, wherein
m is an integer from 3 to 6, and X is a m-valent, linear or branched, aliphatic or cycloaliphatic radical having from 3 to 10 carbon atoms, wherein the radical is unsubstituted or substituted with one or more substituent groups selected from the group consisting of a cyano, hydroxyl, halo, (C1-C6) alkoxy, (C1-C6) alkylthio, thiol and nitro group.

2. The composition of claim 1, wherein the polyhydric alcohol condensate starter is a homocondensate of the polyalcohol of the formula $X(OH)_m$ or a co-condensate of two or more polyalcohols wherein at least one polyalcohol is of the formula $X(OH)_m$ and
the polyhydric alcohol condensate starter comprises from 2 to 50 polyalcohol units of the formula $X(OH)_m$.

3. The composition of claim 1, wherein the polyhydric alcohol condensate starter is at least one condensate selected from the group consisting of a glycerol condensate and a pentaerythritol condensate.

4. The composition of claim 1, wherein the polyhydric alcohol condensate starter comprises at least one condensate of a formula selected from the group consisting of:

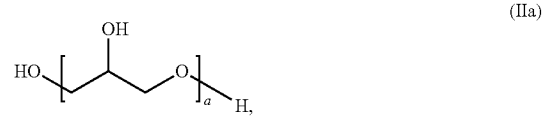

(IIa)

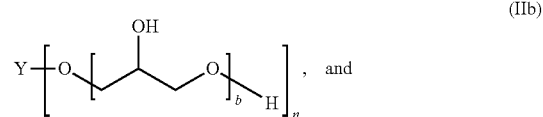

, and (IIb)

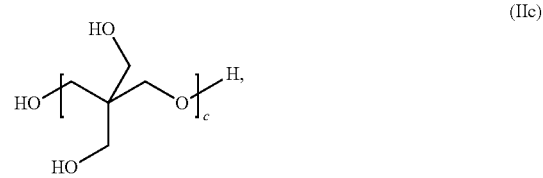

(IIc)

wherein
Y is a n-valent, linear or branched, aliphatic or cycloaliphatic radical having from 1 to 10 carbon atoms, wherein the radical is unsubstituted or substituted with one or more substituent groups selected from the group consisting of a cyano, hydroxyl, halo, (C1-C6) alkoxy, (C1-C6) alkylthio, thiol and nitro group,
a is an integer from 2 to 50,
each b is independently an integer from 1 to 30,
c is an integer from 2 to 3, and
n is an integer from 1 to 6.

5. The composition of claim 1, wherein the alkylene oxide comprises at least one oxide selected from the group consisting of ethylene oxide, propylene oxide, and butylene oxide.

6. The composition of claim 1, wherein the polyoxyalkylene side chains are a copolymer of ethylene oxide with propylene oxide, butylene oxide, or both.

7. The composition of claim 6, wherein the content of ethylene oxide in the copolymer is from 10 to 50% by weight.

8. The composition of claim 6, wherein the polyoxyalkylene side chains are a random copolymer of at least two alkylene oxides.

9. The composition of claim 1, wherein the molecular weight $M_w$ of the polyhydric alcohol condensate comprising polyoxyalkylene side chains is from 3000 to 10000 g/mol.

10. The composition of claim 1, further comprising a leveling agent.

11. The composition of claim 1, wherein the copper ion source comprises at least one member selected from the group consisting of copper sulfate, copper chloride, copper acetate, copper citrate, copper nitrate, copper fluoroborate, copper methane sulfonate, copper phenyl sulfonate and copper p-toluene sulfonate.

12. A composition comprising:
a copper ion source and
at least one suppressing agent produced by a process comprising reacting:
a) a polyhydric alcohol condensate starter, which is a condensation derivative of the formula $$X(OH)_m$$

with
b) an alkylene oxide,
to produce a polyhydric alcohol condensate comprising polyoxyalkylene side chains,
wherein
m is an integer from 3 to 6, and
X is a m-valent, linear or branched, aliphatic or cycloaliphatic radical having from 3 to 10 carbon atoms, wherein the radical is unsubstituted or substituted with one or more substituent groups selected from the group consisting of a cyano, hydroxyl, halo, (C1-C6) alkoxy, (C1-C6) alkylthio, thiol and nitro group; and
an accelerating agent.

13. The composition of claim 12, wherein the accelerating agent is a compound comprising one or more sulfur atom, a sulfonic acid, a sulfonic acid salt, a phosphonic acid or a phosphonic acid salt.

14. The composition of claim 12, wherein the accelerating agent is a compound of the formula:

$$MO_3X\text{—}R^{21}\text{—}(S)_p\text{—}R^{22},$$

wherein:
M is a hydrogen or an alkali metal
X is P or S
p=1 to 6
$R^{21}$ is selected from C1-C8 alkyl group, a heteroalkyl group, an aryl group or a heteroaromatic group
$R^{22}$ is selected from H or —S—$R^{21'}XO_3M$, with $R^{21'}$ being identical or different from $R^{21}$.

15. The composition of claim 12, wherein the accelerating agent is a compound having a formula selected from the group consisting of:

$$MO_3S\text{—}R^{21}\text{—}SH,$$

$$MO_3S\text{—}R^{21}\text{—}S\text{—}S\text{—}R^{21'}\text{—}SO_3M, \text{ and}$$

$$MO_3S\text{—}Ar\text{—}S\text{—}S\text{—}Ar\text{—}SO_3M$$

wherein
$R^{21}$ and $R^{21'}$ are the same or different and are independently selected from C1-C8 alkyl group, a heteroalkyl group, an aryl group or a heteroaromatic group and
Ar is Aryl.

16. The composition of claim 12, wherein the accelerating agent is bis-(3-sulfopropyl)-disulfide disodium salt or 3-mercapto-1-propansulfonic acid, sodium salt.

17. The composition of claim 12, wherein the accelerating agent is at least one selected from the group consisting of 2-mercaptoethanesulfonic acid, sodium salt, N,N-dimethyldithiocarbamic acid (3-sulfopropylester), sodium salt, 3-[(amino-iminomethyl)-thio]-1-propylsulfonic acid, 3-(2-benzthiazolylthio)-1-propanesulfonic acid, sodium salt, 3-mercapto-propylsulfonicacid-(3-sulfopropyl)ester, methyl-($\overline{\omega}$-sulfopropyl)-disulfide, disodium salt, and methyl-($\overline{\omega}$-sulfopropyl)-trisulfide, disodium salt.

18. The composition of claim 12, wherein the accelerating agent is present in an amount ranging from about 0.1 ppm to about 3000 ppm, based on the total weight of the composition.

19. A process for depositing a copper layer on a substrate, comprising:
a) contacting a metal plating bath comprising the composition of claim 1 with the substrate, and
b) applying a current to the substrate, thereby depositing a copper layer onto the substrate.

20. The process of claim 19,
wherein the substrate comprises at least one feature selected from the group consisting of a micrometer sized feature and a submicrometer sized feature, and
wherein applying the current fills the feature.

21. The process of claim 20, wherein the substrate comprises a submicrometer-sized feature having an aperture size from 1 to 30 nm, an aspect ratio of 4 or more, or both.

22. The process of claim 19, wherein a density of the current is from 1 to 250 mA/cm$^2$.

* * * * *